US011841727B2

(12) United States Patent
Downey

(10) Patent No.: US 11,841,727 B2
(45) Date of Patent: Dec. 12, 2023

(54) NMOS PTAT GENERATOR AND VOLTAGE REFERENCE

(71) Applicant: Analog Devices International Unlimited Company, Limerick (IE)

(72) Inventor: Fergus John Downey, Oranmore (IE)

(73) Assignee: Analog Devices International Unlimited Company, Limerick (IE)

( * ) Notice: Subject to any disclaimer, the term of this patent is extended or adjusted under 35 U.S.C. 154(b) by 168 days.

(21) Appl. No.: 17/200,265

(22) Filed: Mar. 12, 2021

(65) Prior Publication Data

US 2021/0286395 A1 Sep. 16, 2021

Related U.S. Application Data

(60) Provisional application No. 62/989,096, filed on Mar. 13, 2020.

(51) Int. Cl.
*G05F 3/26* (2006.01)
*G05F 3/24* (2006.01)
*H01L 27/088* (2006.01)

(52) U.S. Cl.
CPC .............. *G05F 3/262* (2013.01); *G05F 3/245* (2013.01); *G05F 3/247* (2013.01); *H01L 27/088* (2013.01)

(58) Field of Classification Search
CPC .......... G05F 3/262; G05F 3/222; G05F 3/245; G05F 3/247; H01L 27/088
USPC ........................................................ 323/313
See application file for complete search history.

(56) References Cited

U.S. PATENT DOCUMENTS

| 3,320,439 | A | 5/1967 | Widlar |
| 3,975,648 | A | 8/1976 | Tobey, Jr. et al. |
| 4,327,320 | A | 4/1982 | Oguey et al. |
| 5,384,740 | A | 1/1995 | Etoh et al. |
| 5,949,278 | A | 9/1999 | Oguey |
| 6,518,833 | B2 | 2/2003 | Narendra et al. |
| 2009/0189591 | A1 | 7/2009 | Sperling et al. |
| 2010/0237848 | A1* | 9/2010 | Kalyanaraman .......... G05F 3/30 323/313 |

(Continued)

FOREIGN PATENT DOCUMENTS

CN 103529897 A 1/2014

OTHER PUBLICATIONS

Blaurschild, Robert A., et al., "Session III: Compatible Analog and Digital Technology—WAM 3.5: An NMOS Voltage Reference", Proc. of the IEEE Intl. Solid-State Circuit Conference, (Feb. 15, 1978), 2 pgs.

(Continued)

*Primary Examiner* — Yemane Mehari
(74) *Attorney, Agent, or Firm* — Schwegman Lundberg & Woessner, P.A.

(57) ABSTRACT

A reference generator system can include a PTAT circuit coupled to a signal supply node and configured to provide a voltage reference signal or a current reference signal that is based on a physical characteristic of one or more components of the PTAT circuit and a correction signal. The system can include a CTAT circuit coupled to the PTAT circuit and configured to provide the correction signal to the PTAT circuit. In an example, the reference generator system can be implemented at least in part using NMOS devices that comprise a portion of an indium gallium zinc oxide (IGZO) substrate.

20 Claims, 3 Drawing Sheets

(56) References Cited

U.S. PATENT DOCUMENTS

2016/0094124 A1* 3/2016 Al-Shyoukh ........... G05F 3/242
  323/271
2019/0220049 A1* 7/2019 Qiu ......................... H03F 3/45

OTHER PUBLICATIONS

Hosono, Hideo, "How we made the IGZO transistor", Nature Electronics vol. 1, (Jul. 2018), 1 pg.

Vittoz, E., et al., "CMOS Analog Integrated Circuits Based on Weak Inversion Operation", IEEE Journal of Solid-State Circuits, 12(3), (Jun. 1977), 8 pgs.

* cited by examiner

NMOS PTAT GENERATOR AND VOLTAGE REFERENCE

CLAIM OF PRIORITY

This application is related to and claims priority to U.S. Provisional Application No. 62/989,096, filed on Mar. 13, 2020, and entitled "NMOS PTAT Generator and Voltage Reference," the entirety of which is incorporated herein by reference.

BACKGROUND

A voltage reference circuit ideally provides an output signal having a fixed or constant voltage level. The output signal can be substantially constant over time and can be independent of circuit loading, power supply variation, or temperature change. Voltage reference circuits can be used in power supplies, analog-to-digital converter (ADC) circuits, digital-to-analog converter (DAC) circuits, measurement devices, or control systems.

Some semiconductor devices can be used as a reference device or component in a reference-providing circuit. For example, a semiconductor diode with an exponential voltage/current characteristic can provide an effective knee voltage that can be used as a voltage reference. Diodes can have relatively strong temperature dependence, which can make them useful for temperature measurement or for bias compensation applications.

In an example, a voltage reference circuit can include a bandgap reference circuit. In a bandgap reference circuit, a voltage difference between two p-n junctions (e.g., diodes) operated at different current densities can be used to generate a first current that is proportional to absolute temperature (PTAT) in a first resistor. This first current can then be used to generate a voltage across a second resistor. The voltage across the second resistor can be added to a voltage of one of the two p-n junctions, or to a different junction or device, in some examples. The voltage across a diode operated at constant current is complementary to absolute temperature (CTAT), with a temperature coefficient of approximately −2 mV/K. Based on a ratio of the values of the first and second resistors, first order effects of temperature dependency of the diodes and the PTAT current can cancel out. The resulting voltage can be used as a reference, such as provided at about 1.2-1.3 V depending on the particular technology used, which is close to the theoretical 1.22 eV bandgap of silicon at 0 K.

OVERVIEW

The present inventor has recognized, among other things, that a problem to be solved includes implementing a voltage reference circuit using an indium gallium zinc oxide (IGZO) process. Indium gallium zinc oxide (IGZO) is a semiconducting material made of indium (In), gallium (Ga), zinc (Zn) and oxygen (O). IGZO thin-film transistors (TFT) are used, among other places, in backplanes of flat-panel displays (FPDs). IGZO-TFT has 20-50 times the electron mobility of amorphous silicon, which has often been used in liquid-crystal displays (LCDs) and e-papers. Owing to its higher electron mobility, IGZO-TFT can, for example, improve the speed, resolution and size of flat-panel displays.

In an example, a solution to the above-described problem can include or use area-mismatched NMOS transistors, such as a first transistor and a second transistor. The solution can include a voltage divider circuit coupled to a source terminal of the first transistor, and the voltage divider circuit can include an input node, an output node, and an intermediate node. In an example, the solution can include an amplifier circuit, such as an operational amplifier circuit, configured to receive signals from the intermediate node and from a source terminal of the second transistor. The amplifier circuit can be configured to provide a reference output signal at the gate terminals of the first and second transistors, and the reference output signal can be substantially proportional to a temperature of the first and/or second transistors. In an example, the amplifier circuit is configured to provide a virtual ground at the intermediate node of the voltage divider circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A non-silicon-based process can be used to implement various analog circuits or devices. Non-silicon-based processes can be desirable for ease of manufacturing, reduced cost of materials, and thus reduced system or part cost. Non-silicon-based approaches can include organic and inorganic processes. In an example, a non-silicon-based process can include an indium gallium zinc oxide (IGZO) process. In an example, a combination of organic, inorganic, and/or silicon-based processes can be used to produce semiconductor circuitry.

In an example, thin-film transistors, or TFTs, can be implemented using an IGZO process. TFTs can be used in thin film electronics, including for example as pixel switching elements on flat panel displays (FPDs). Various other components or devices can be implemented using TFTs or using other elements formed using IGZO processes.

In an example, digital-to-analog (DAC) converter circuits or analog-to-digital (ADC) converter circuits can be implemented using IGZO processes. Such circuits can generally include or use a reference circuit, such as a voltage reference circuit or a current reference circuit. That is, such ADC or DAC circuits can include or use a reference circuit that provides a stable voltage or current signal when other parameters vary, such as a temperature or supply signal magnitude.

In an example, IGZO-based TFTs or other components can be used to provide a voltage reference circuit. Such a reference circuit can be implemented in combination with other systems or components, such as using the same IGZO process or substrate. In an example, an Internet-of-Things (IoT) sensor or other network-coupled device can include or use a voltage reference circuit. The sensor or other network-coupled device can be implemented using the same process as the voltage reference circuit, such as using an IGZO process.

Figure 1:
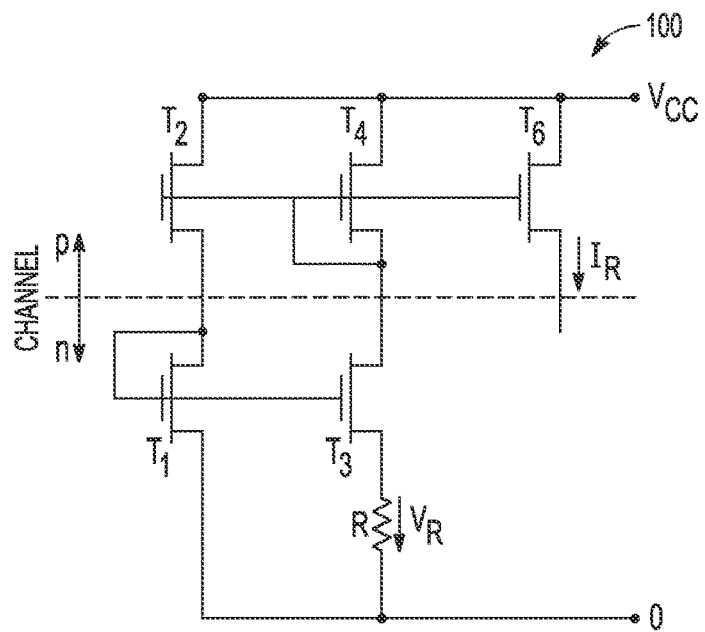
FIG. 1 illustrates generally an example of a circuit that provides a reference current signal.

Various circuits can be used to provide a reference signal, such as a reference voltage or reference current. FIG. 1, for example, illustrates generally an example 100 of a current reference circuit for a CMOS-based implementation. In the example 100 of FIG. 1, two p-type transistors $T_2$ and $T_4$ form a first current mirror having a first gain (e.g., $S_2/S_4$). The two n-type transistors $T_1$ and $T_3$ form a second current mirror having a second gain (e.g., $S_3/S_1$), such as when the current is small enough so that a resistance of the resistor R can be neglected. The two current mirrors can be connected in a loop as shown in FIG. 1, and the loop gain can be provided as a product of the first and second gains. The loop gain for small currents can be chosen to be greater than 1 such that current in each branch increases until an equilibrium condition is reached. At equilibrium, the gain can be reduced to 1 by a voltage drop $V_R$ across the resistor R. In an example, if $T_1$ and $T_3$ operate in weak inversion, then the equilibrium voltage can be calculated when the supply voltage Vcc is high enough to ensure drain current saturation of $T_2$ and $T_3$. At equilibrium, a reference current proportional to $V_R/R$ can be generated. An output signal, such as a reference current $I_R$, can be provided by a current mirror that includes the transistors $T_4$ and $T_6$.

The example 100 of a CMOS-based implementation of a reference generator circuit functions well, however, it generally cannot be implemented using an NMOS-only process, such as using IGZO-based semiconductors.

In an example, a reference circuit can provide a reference signal, and the reference circuit can be implemented using a non-silicon-based process, such as an IGZO process. In an example, n-type material can be available using an IGZO process and p-type material can be unavailable. Other processes, including processes with only p-type material, or a combination of n-type and p-type materials, can similarly be used.

In an example, the reference circuit can include a PTAT circuit and a CTAT circuit. The PTAT circuit can provide a first signal that is proportional to an absolute temperature of the circuit or of a device therein, and the CTAT circuit can provide a second signal, or a correction or compensation signal, that can be complementary to an absolute temperature of the circuit or of the device therein. The first and second signals from the PTAT circuit and the CTAT circuit, respectively, can be used together to provide a common, stable reference output signal.

Figure 2:
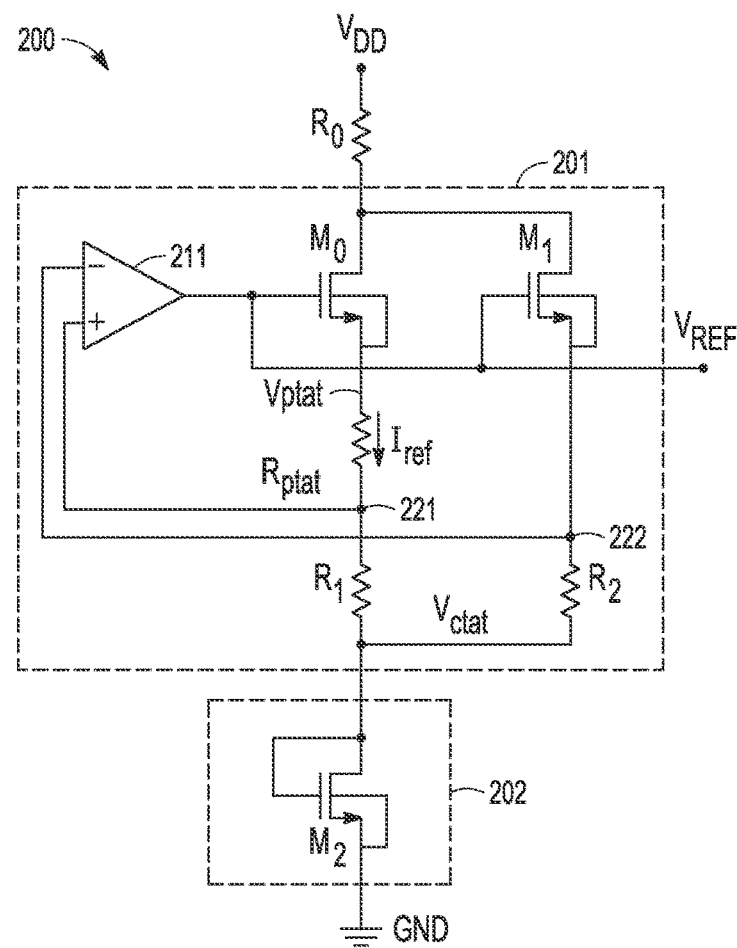
FIG. 2 illustrates generally an example of a reference circuit that can generate a reference voltage signal or a reference current signal.

FIG. 2 illustrates generally an example of reference circuit 200 configured to provide a voltage reference signal $V_{REF}$. The reference circuit 200 can include a PTAT circuit 201 coupled to a CTAT circuit 202. The example of FIG. 2 can include, or can be implemented using, a non-silicon process such as an IGZO process. In some examples, the reference circuit 200 can comprise exclusively n-type material.

The example of FIG. 2 includes, in the PTAT circuit 201, a first FET device or first transistor M0 and a second FET device or second transistor M1. A drain terminal of the first transistor M0 can be coupled to a drain terminal of the second transistor M1. The drain terminals of the first and second transistors M0 and M1 can be coupled to a supply rail via a first resistor $R_0$. The supply rail can provide a supply voltage $V_{DD}$. In an example, the transistors in the reference circuit 200 can include enhanced-mode FET devices, such as can be implemented or built using an IGZO-based semiconductor, such as on a plastic substrate.

In an example, the first and second transistors M0 and M1 can have different device characteristics. For example, the devices can have different physical sizes or areas. In an example, the first transistor M0 can be effectively several times larger than the second transistor M1. For example, the first transistor M0 can include multiple instances of parallel-connected transistors that together provide a composite first transistor M0 that has an effective area that is several times greater than an effective area of one or multiple devices that comprise the second transistor M1. In an example, the first transistor M0 has an effective area that is about nine times greater than an area of the second transistor M1. For example, the first transistor M0 can include 36 transistor devices that are coupled in parallel, and the second transistor M1 can include 4 transistor devices that are coupled in parallel. The first and second transistors M0 and M1 can thus have different physical and operational characteristics, such as different Vgs threshold voltages.

In an example, a source terminal of the first transistor M0 can be coupled to a voltage divider circuit that includes a series-coupled PTAT resistor Rptat and a first resistor $R_1$. The PTAT resistor Rptat and the first resistor $R_1$ can be coupled at a first node 221, and the first node 221 can be coupled to a non-inverting input terminal of a first operational amplifier 211. A source terminal of the second transistor M1 can be coupled, at a second node 222, to a second resistor R2 and to an inverting input terminal of the first operational amplifier 211. In the example of FIG. 2, an output terminal of the operational amplifier 211 can provide an output signal $V_{REF}$, a voltage reference signal.

In an example, the operational amplifier 211 is configured to drive the first node 221 and the second node 222 to have substantially the same voltage level. That is, the operational amplifier 211 is configured to adjust the output signal $V_{REF}$ to minimize any difference between voltages at the first node 221 and the second node 222, such as corresponding respectively to the inputs to the non-inverting and inverting terminals of the operational amplifier 211. In an example, the operational amplifier 211 provides a virtual ground at the first node 221 and the second node 222. Values of the first and second resistors R1 and R2 can be selected to adjust a magnitude of the signal at the virtual ground, as further explained below.

The output terminal of the operational amplifier 211 can be coupled to each of the gates of the first and second transistors M0 and M1. Accordingly, the operational amplifier 211 drives a common current signal through the area-mismatched first and second transistors M0 and M1, and the transistors can operate in a sub-threshold region. Owing to the area mismatch of the transistors, the first transistor M0 can use a lower Vgs to maintain the same amount of current flowing in the first transistor M0 and the second transistor M1. In other words, a gate-source voltage Vgs-$_{M0}$ of the first transistor M0 can be less than a gate-source voltage Vgs-$_{M1}$ of the second transistor M1. A resulting voltage Vptat across the PTAT resistor Rptat can correspond to a difference between the gate-source voltage Vgs-$_{M0}$ of the first transistor M0 and a gate-source voltage Vgs-$_{M1}$ of the second transistor M1. Since the gate-source voltage Vgs of the transistors is based on a thermal voltage characteristic (e.g., $V_T$=kT/q), the proportional-to-temperature voltage Vptat can be used to provide a reference quantity. In an example, a reference current Iref can be based on the voltage Vptat and the resistance value of the PTAT resistor Rptat (e.g., Iref=Vptat/Rptat). The reference current Iref and the values of the first and second resistors R1 and R2 can be used to balance or tune the values of Vptat and Vctat.

The PTAT circuit 201 can thus provide an output signal $V_{REF}$ that is substantially independent of the supply voltage $V_{DD}$. The output signal $V_{REF}$, however, can have some variation with temperature. The CTAT circuit 202 can optionally be used together with the PTAT circuit 201 to provide an output signal with enhanced stability over changes in temperature, for example, relative to an output signal provided by the PTAT circuit 201 alone.

In an example, the PTAT circuit 201 can be used alone, such as without the CTAT circuit 202. In this example, the output signal $V_{REF}$ can be a function of physical characteristics of the first transistor M0, the voltage Vptat across the PTAT resistor Rptat, and a voltage at the first node 221. In an example, the first and second resistors R1 and R2 can have substantially the same resistance value R. Accordingly, the voltage at the first node 221 can be given by a product of the resistance R and the magnitude of the reference current Iref. That is, $$V_{REF}=Vgs\_ptat+Vptat+(Iref*R),$$

where Vgs_ptat=ln (id/i0)/(q/mkT) for the first transistor M0, and Vptat=ln (9)/(q/mkT), such as when the first transistor M0 is nine-times larger than the second transistor M1. The gate-source voltage Vgs_ptat for the first transistor M0, for example, can be a function of a drain current id of the first transistor M0 and an off current i0 of the first transistor M0.

The value of Vptat can be derived as follows. In an example, a drain current for the first transistor M0 can be given by the following expression:

$$I_{D-M0}=[I_0 \exp(qV_{GS}/mkT)]*[1-\exp(-qV_{DS}/kT)].$$

When the first transistor M0 is in saturation with Vds>>q/kT, then the $V_{DS}$-related term can be ignored. Owing to the effective area mismatch between the first and second transistors M0 and M1, Vptat can be selected to reduce the Vgs of the first transistor M0 such that the theoretical drain current is 1/9 of the total. That is, $$1/9=\exp(q/mkT*(Vgs-Vptat)), \text{ or}$$

$$1/9=(\exp((q/mkT)*Vgs)/\exp((q/mkT)*Vds)).$$

Accordingly, exp((q/mkT)*Vptat)=9, and Vptat=ln(9)/(q/mkT)=2.19*m/38.2. In an example, m=4 for IGZO NMOS, and therefore Vptat=0.23V.

In an example, the PTAT circuit 201 can be used together with the CTAT circuit 202. The example of FIG. 2 includes, in the CTAT circuit 202, a diode-connected FET device or third transistor M2. In an example, the CTAT circuit 202 can receive, at a drain terminal of the third transistor, a voltage signal Vctat from the PTAT circuit 201. The third transistor M2 can operate in a saturation region.

In an example with the PTAT circuit 201 used together with the CTAT circuit 202, the output signal $V_{REF}$ can be a function of physical characteristics of the first transistor M0, the voltage Vptat across the PTAT resistor Rptat, a voltage at the first node 221, and a drain-source voltage Vds of the third transistor M2. As similarly explained above, the first and second resistors R1 and R2 can have substantially the same resistance value R, and a voltage at the first node 221 can be given by a product of the resistance R and the magnitude of the reference current Iref. Accordingly, $$V_{REF}=Vgs\_ptat+Vptat+(Iref*R)+Vds\_vth$$

where Vds_vth=Vgs−Vth, wherein Vth is a temperature-dependent threshold voltage for the third transistor M2. A value of the threshold voltage Vth can be complementary to absolute temperature.

In an example, a temperature sensor system can be provided. The temperature sensor system can include a comparator circuit and a reference generator, and the reference generator can be provided using the reference circuit 200. In the example of the reference circuit 200, a signal proportional to absolute temperature can be provided based on the difference in gate-to-source voltages of the first and second transistors M0 and M1. The difference, as shown above, can be substantially stable over process and temperature, such as relative to another device or component that can be complementary to absolute temperature, or a CTAT device. In an example, the comparator circuit can be configured to determine a difference between a value measured from the CTAT device and a value of a balanced output from the reference circuit 200, such as the output signal $V_{REF}$ or the current Iref. Information about an absolute temperature can then be provided based on the result from the comparator.

Figure 3:
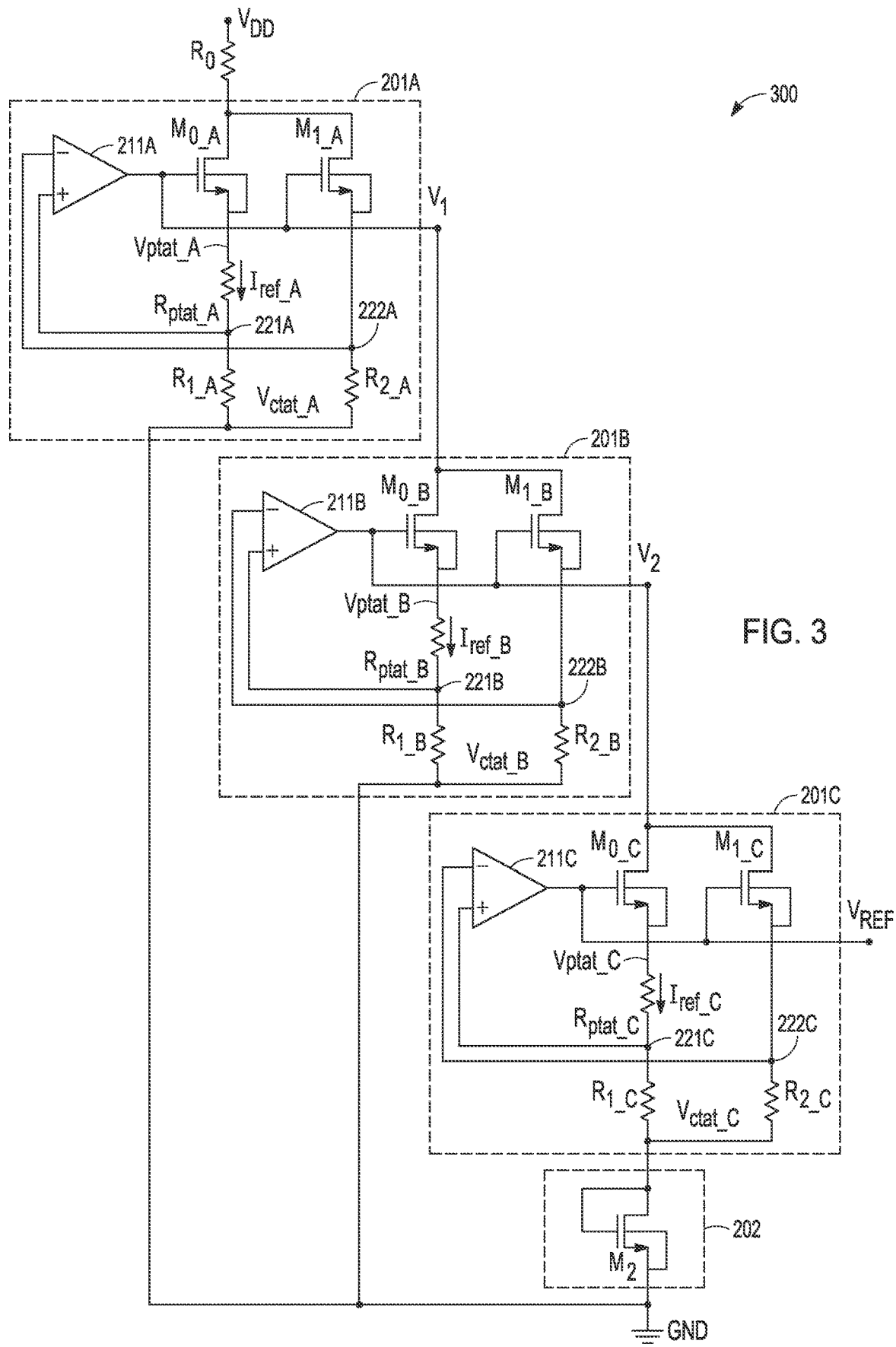
FIG. 3 illustrates generally an example of a multiple-stage reference circuit.

In an example, multiple instances of the PTAT circuit 201 can be stacked or combined, such as to increase a power supply rejection ratio (PSRR). FIG. 3 illustrates generally an example 300 of three different PTAT stages that can be coupled or stacked.

The example 300 of FIG. 3 includes a first PTAT circuit stage 201A that receives the supply voltage $V_{DD}$ and provides a first voltage $V_1$, where $V_1$=Vgs_ptat_A+Vptat_A+(Iref_A*$R_A$)+Vds_vth_A, and where resistors $R_{1\_A}$ and $R_{2\_A}$ have resistance $R_A$. The example 300 of FIG. 3 includes a second PTAT circuit stage 201B that receives the first voltage $V_1$ at drain terminals of transistors M0_B and M1_B and provides a second voltage $V_2$, where $V_2$=Vgs_ptat_B+Vptat_B+(Iref_B*$R_B$)+Vds_vth_B, and where resistors $R_{1\_B}$ and $R_{2\_B}$ have resistance $R_B$. The example 300 of FIG. 3 can include a third PTAT circuit stage 201C that receives the second voltage $V_2$ at drain terminals of transistors $M_{0\_B}$ and $M_{1\_B}$ and provides a reference output voltage $V_{REF}$, where $V_{REF}$=Vgs_ptat_C+Vptat_C+(Iref_C*$R_C$)+Vds_vth_C, and where resistors $R_{1\_C}$ and $R_{2\_C}$ have resistance $R_C$. In the example 300 of FIG. 3, the same CTAT circuit 202 can be coupled to terminals of the resistors $R_{1\_C}$ and $R_{2\_C}$ to provide the output voltage $V_{REF}$ with enhanced stability over changes in temperature. In an example, multiple instances of the CTAT circuit 202 can be used.

In an example, the PTAT circuit 201 can be used as a stable rail or supply source for one or more other circuits or systems. For example, the PTAT circuit 201 can comprise a portion of a system that can include a circuit that can use a stable reference supply. In an example, the system can include an ADC circuit and the PTAT circuit 201 can provide a reference voltage used by the ADC in its conversion of analog signals to digital signals.

Various components of the reference circuit 200 can be physically adjusted or trimmed to tune performance of the circuit. For example, one or more of the first and second resistors R1 and R2 can be trimmed such as to ensure resistance values of the resistors are well-matched. In an example, an IGZO-based process can produce well-matched resistors and thus no trimming or minimal trimming can be used. In an example, trimming can be used to reduce offset or gain characteristics of the operational amplifier 211. In an example, trimming can be used to select a number or configuration of transistor instances con a substrate to couple in parallel, such as can comprise the first or second transistors M1 or M2. Other elements can similarly be trimmed or adjusted.

Figure 4:
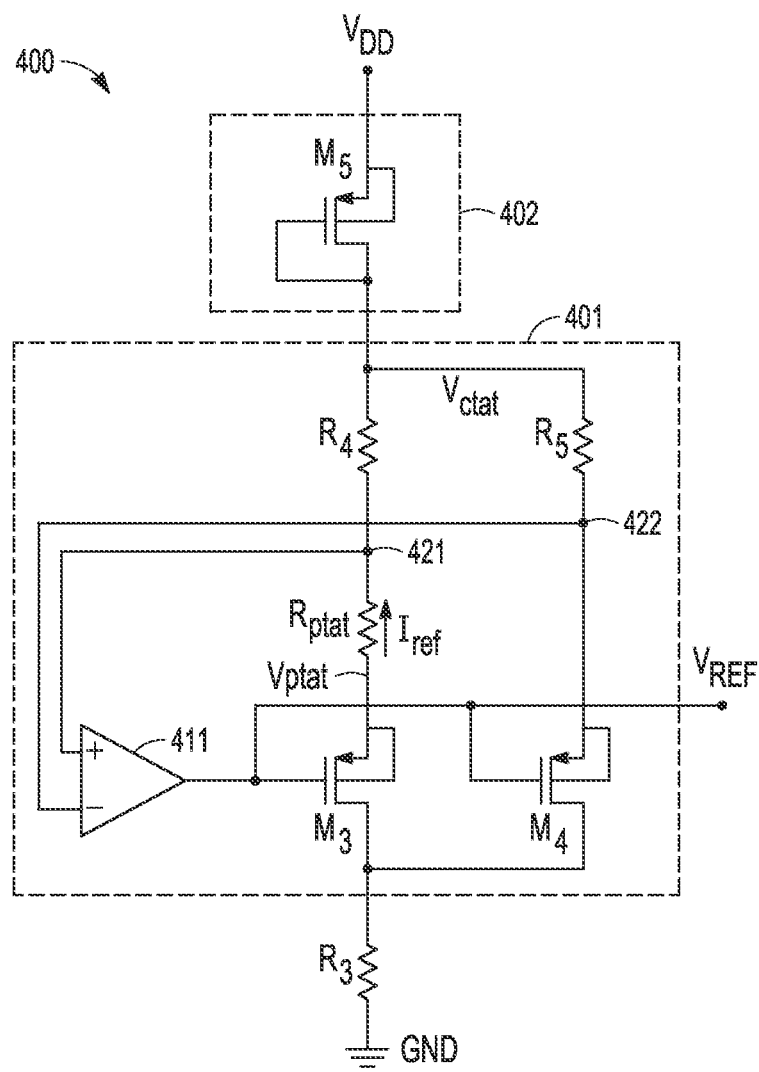
FIG. 4 illustrates generally an example of a reference circuit implemented using PMOS devices.

In an example, the reference circuit 200 can be implemented or built using various processes. For example, the reference circuit 200 can be implemented using an IGZO process, such as can be used to provide NMOS devices. In an example, the reference circuit 200 can be implemented using an organic process, such as can include or use PMOS devices. FIG. 4 illustrates generally an example of a second reference circuit 400 that includes PMOS devices $M_3$ and $M_4$ in a PTAT stage, and a PMOS device $M_5$ in a CTAT stage.

Various aspects of the present disclosure can help provide a solution to the reference signal-related problems identified herein. In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a reference signal generator circuit comprising an input node configured to receive a source voltage signal, first and second transistors having respective drain terminals coupled to the input node, and having respective gate terminals coupled to a reference signal output node, and an operational amplifier circuit including: an amplifier output coupled to the reference signal output node, a first input terminal coupled to a source terminal of the second transistor, and a second input terminal coupled via a first resistor to a source terminal of the first transistor. In an example, the operational amplifier in Aspect 1 can be configured to provide an output signal at the amplifier output such that a voltage across the first resistor is substantially the same as a difference between a gate-source voltage of the first transistor and a gate-source voltage of the second transistor.

Aspect 2 can include or use, or can optionally be combined with the subject matter of Aspect 1, to optionally include or use the first and second transistors having different effective device area characteristics.

Aspect 3 can include or use, or can optionally be combined with the subject matter of Aspect 2, to optionally include or use a resistance of the first resistor being greater than a resistance of a second resistor, wherein the second resistor is coupled between the first resistor and a reference node.

Aspect 4 can include or use, or can optionally be combined with the subject matter of one or any combination of Aspects 1 through 3 to optionally include the first and second transistors, the operational amplifier, and the resistor implemented using an IGZO process.

Aspect 5 can include or use, or can optionally be combined with the subject matter of Aspect 4, to optionally include or use the first and second transistors as NMOS transistor devices.

Aspect 6 can include or use, or can optionally be combined with the subject matter of one or any combination of Aspects 1 through 5 to optionally include the operational amplifier providing a virtual ground at the second input terminal.

Aspect 7 can include or use, or can optionally be combined with the subject matter of one or any combination of Aspects 1 through 3 or Aspect 6 to optionally include the first and second transistors, the operational amplifier, and the resistor being implemented using an organic process.

Aspect 8 can include or use, or can optionally be combined with the subject matter of Aspect 7, to optionally include or use the first and second transistors as PMOS transistors.

Aspect 9 can include or use, or can optionally be combined with the subject matter of one or any combination of Aspects 1 through 8 to optionally include the output signal being substantially proportional to an absolute temperature of the first and second transistors.

Aspect 10 can include or use, or can optionally be combined with the subject matter of Aspect 9, to optionally include or use a compensation circuit configured to provide a compensation signal that is substantially complementary to an absolute temperature of a third transistor, and the output signal can be based in part on the compensation signal.

Aspect 11 can include or use, or can optionally be combined with the subject matter of Aspect 10, to optionally include or use a second resistor coupled between the first resistor and the compensation circuit.

Aspect 12 can include or use, or can optionally be combined with the subject matter of Aspect 11, to optionally include or use the third transistor as a diode-connected transistor.

Aspect 13 can include or use, or can optionally be combined with the subject matter of Aspect 1 or Aspect 12, to optionally include or use a third resistor coupled between the compensation circuit and the source terminal of the second transistor.

Aspect 14 can include or use, or can optionally be combined with the subject matter of Aspect 13, to optionally include or use the second and third resistors have substantially the same resistance value. The resistance value can be determined empirically, such as by experimentation to balance PTAT and CTAT voltages in the system.

In an example, Aspect 15 can include or use subject matter (such as an apparatus, a system, a device, a method, a means for performing acts, or a device readable medium including instructions that, when performed by the device, can cause the device to perform acts, or an article of manufacture), such as can include or use a reference signal generator circuit using n-type metal oxide semiconductor (NMOS) devices that comprise a portion of an indium gallium zinc oxide (IGZO) substrate. In Aspect 15, the reference signal generator circuit can include a first transistor having a first device area characteristic, a second transistor having a different second device area characteristic, a voltage divider circuit coupled to a source terminal of the first transistor, the voltage divider circuit including an input node, an output node, and an intermediate node, and an amplifier circuit configured to receive signals from the intermediate node and from a source terminal of the second transistor, wherein the amplifier circuit is configured to provide a reference output signal at the gate terminals of the first and second transistors, wherein the reference output signal is substantially proportional to a temperature of the first and/or second transistors.

Aspect 16 can include or use, or can optionally be combined with the subject matter of Aspect 15, to optionally include or use the voltage divider circuit as series-coupled first and second resistors, wherein the first resistor is coupled to the intermediate node and the source terminal of the first transistor, and the second resistor is coupled to the intermediate node and a circuit ground node.

Aspect 17 can include or use, or can optionally be combined with the subject matter of Aspect 16, to optionally include or use a third resistor coupled between the source terminal of the second transistor and the circuit ground node.

Aspect 18 can include or use, or can optionally be combined with the subject matter of one or any combination of Aspects 15 through 17 to optionally include a compensation circuit coupled to the output node of the voltage divider circuit, wherein the compensation circuit is configured to adjust a voltage at the intermediate node using a device that provides a signal that is complementary to an absolute temperature (CTAT) of the device.

In an example, Aspect 19 can include or use subject matter (such as an apparatus, a system, a device, a method, a means for performing acts, or a device readable medium including instructions that, when performed by the device, can cause the device to perform acts, or an article of manufacture), such as can include or use a method for generating a reference signal. The method of Aspect 19 can include providing first and second transistors with different area characteristics, providing a first resistor having first and second nodes, the first node coupled with a source terminal of the first transistor. Aspect 19 can include, using an amplifier circuit: generating a virtual ground at a source terminal of the second transistor and at the second node of the first resistor, and providing the reference signal based a voltage across the first resistor.

Aspect 20 can include or use, or can optionally be combined with the subject matter of Aspect 19, to optionally include using a compensation circuit to provide a compensation signal that is complementary to an absolute temperature of the compensation circuit, wherein providing the reference signal includes using the voltage across the first resistor and the compensation signal from the compensation circuit.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. The present inventor contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A reference signal generator circuit comprising:
an input node configured to receive a source voltage signal;
first and second transistors having respective drain terminals coupled to the input node, and having respective gate terminals coupled to a reference signal output node; and
an operational amplifier circuit including:
an amplifier output coupled to the reference signal output node;
a first input terminal coupled to a source terminal of the second transistor; and
a second input terminal coupled via a first resistor to a source terminal of the first transistor;
wherein the operational amplifier is configured to provide an output signal at the amplifier output such that a voltage across the first resistor is substantially the same as a difference between a gate-source voltage of the first transistor and a gate-source voltage of the second transistor.

2. The reference signal generator circuit of claim 1, wherein the first and second transistors have different effective device area characteristics.

3. The reference signal generator circuit of claim 2, wherein a resistance of the first resistor is greater than a resistance of a second resistor, wherein the second resistor is coupled between the first resistor and a reference node.

4. The reference signal generator circuit of claim 1, wherein the first and second transistors, the operational amplifier, and the resistor are implemented using an IGZO process.

5. The reference signal generator circuit of claim 4, wherein the first and second transistors are NMOS transistor devices.

6. The reference signal generator circuit of claim 1, wherein the operational amplifier provides a virtual ground at the second input terminal.

7. The reference signal generator circuit of claim 1, wherein the first and second transistors, the operational amplifier, and the resistor are implemented using an organic process.

8. The reference signal generator circuit of claim 7, wherein the first and second transistors are PMOS transistors.

9. The reference signal generator circuit of claim 1, wherein the output signal is substantially proportional to an absolute temperature of the first and second transistors.

10. The reference signal generator circuit of claim 9, further comprising a compensation circuit configured to provide a compensation signal that is substantially complementary to an absolute temperature of a third transistor, and wherein the output signal is based in part on the compensation signal.

11. The reference signal generator circuit of claim 10, further comprising a second resistor coupled between the first resistor and the compensation circuit.

12. The reference signal generator circuit of claim 11, wherein the third transistor is a diode-connected transistor.

13. The reference signal generator circuit of claim 11, further comprising a third resistor coupled between the compensation circuit and the source terminal of the second transistor.

14. The reference signal generator circuit of claim 13, wherein the second and third resistors have substantially the same resistance value.

15. A reference signal generator circuit using n-type metal oxide semiconductor (NMOS) devices that comprise a portion of an indium gallium zinc oxide (IGZO) substrate, the reference signal generator circuit comprising:
   a first transistor having a first device area characteristic;
   a second transistor having a different second device area characteristic;
   a voltage divider circuit coupled to a source terminal of the first transistor, the voltage divider circuit including an input node, an output node, and an intermediate node; and
   an amplifier circuit configured to receive signals from the intermediate node and from a source terminal of the second transistor, wherein the amplifier circuit is configured to provide a reference output signal at respective gate terminals of the first and second transistors, wherein the reference output signal is substantially proportional to a temperature of the first and/or second transistors.

16. The reference signal generator circuit of claim 15, wherein the voltage divider circuit comprises series-coupled first and second resistors, wherein the first resistor is coupled to the intermediate node and the source terminal of the first transistor, and the second resistor is coupled to the intermediate node and a circuit ground node.

17. The reference signal generator circuit of claim 16, further comprising a third resistor coupled between the source terminal of the second transistor and the circuit ground node.

18. The reference signal generator circuit of claim 15, further comprising a compensation circuit coupled to the output node of the voltage divider circuit, wherein the compensation circuit is configured to adjust a voltage at the intermediate node using a device that provides a signal that is complementary to an absolute temperature (CTAT) of the device.

19. A method for generating a reference signal, the method comprising:
   providing first and second transistors with different device size characteristics;
   providing a first resistor having first and second nodes, the first node coupled with a source terminal of the first transistor; and
   using an amplifier circuit:
      receiving signals from an intermediate node and from a source terminal of the second transistor, wherein the intermediate node comprises a node in a voltage divider circuit; and
      in response to the received signals, providing the reference signal at respective gate terminals of the first and second transistors, wherein the reference signal is substantially proportional to a temperature of the first and/or second transistors.

20. The method of claim 19, further comprising using a compensation circuit to provide a compensation signal that is complementary to an absolute temperature of the compensation circuit, wherein providing the reference signal includes using the voltage across the first resistor and the compensation signal from the compensation circuit.

* * * * *